US011002795B2

(12) United States Patent
Choi et al.

(10) Patent No.: US 11,002,795 B2
(45) Date of Patent: May 11, 2021

(54) CHARGER WITH BATTERY DIAGNOSIS FUNCTION AND CONTROL METHOD THEREOF

(71) Applicant: Foundation of Soongsil University-Industry Cooperation, Seoul (KR)

(72) Inventors: Woo Jin Choi, Seoul (KR); Duck Min Kim, Incheon (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 126 days.

(21) Appl. No.: 16/243,511

(22) Filed: Jan. 9, 2019

(65) Prior Publication Data
US 2019/0293722 A1    Sep. 26, 2019

(30) Foreign Application Priority Data
Mar. 26, 2018 (KR) .......................... 10-2018-0034268

(51) Int. Cl.
*G01R 31/389*    (2019.01)
*G01R 31/36*    (2020.01)
(Continued)

(52) U.S. Cl.
CPC .......... *G01R 31/389* (2019.01); *G01R 31/36* (2013.01); *G01R 31/367* (2019.01);
(Continued)

(58) Field of Classification Search
CPC .... G01R 31/36; G01R 31/367; G01R 31/371; G01R 31/389; H02J 2207/20; H02J 7/00; H02J 7/0021; H02J 7/0047
See application file for complete search history.

(56) References Cited

U.S. PATENT DOCUMENTS

2005/0274611 A1    12/2005    Schlichting
2011/0313699 A1*  12/2011    Hirai ................ H01M 10/3909
702/63
(Continued)

FOREIGN PATENT DOCUMENTS

KR           10-1487577 B1    1/2015
KR      10-2015-0025932 A     3/2015
(Continued)

*Primary Examiner* — Vuthe Siek
(74) *Attorney, Agent, or Firm* — Novick, Kim & Lee, PLLC; Sang Ho Lee

(57) ABSTRACT

Provided is a charger with a battery diagnosis function and a control method thereof. The charger with a battery diagnosis function includes a DC-DC converter configured to operate in a charging mode to charge a battery or to operate in a diagnosing mode to apply a perturbation voltage to the battery when the battery is fully charged, and a digital signal processor configured to calculate an equivalent circuit model parameter of the battery according to an output response of the battery with respect to the perturbation voltage, to calculate a charging/discharging frequency of the battery by using an ohmic resistance value among the equivalent circuit model parameter of the battery, and to calculate a residual equivalent capacity of the battery by using the charging/discharging frequency of the battery.

10 Claims, 5 Drawing Sheets

(51) Int. Cl.
*G01R 31/367* (2019.01)
*G01R 31/371* (2019.01)
*H02J 7/00* (2006.01)

(52) U.S. Cl.
CPC .............. *G01R 31/371* (2019.01); *H02J 7/00* (2013.01); *H02J 7/0021* (2013.01); *H02J 7/0047* (2013.01); *H02J 2207/20* (2020.01)

(56) References Cited

U.S. PATENT DOCUMENTS

2015/0288197 A1* 10/2015 Choi ........................ H02J 7/007
 320/107
2018/0340983 A1* 11/2018 Li ...................... G01R 31/3842

FOREIGN PATENT DOCUMENTS

| KR | 10-1511655 B1 | 4/2015 |
|----|---------------|--------|
| KR | 10-2016-0090226 A | 7/2016 |

* cited by examiner

CHARGER WITH BATTERY DIAGNOSIS FUNCTION AND CONTROL METHOD THEREOF

CROSS-REFERENCE TO RELATED APPLICATIONS

The instant application claims priority to Korean patent application No. 10-2018-0034268 filed on Mar. 26, 2018, the entire disclosure of which is hereby incorporated by reference.

TECHNICAL FIELD

This disclosure relates to a charger with a battery diagnosis function and a control method thereof, and more particularly, to a charger capable of diagnosing the SOH (State-Of-Health) of a battery and a control method thereof.

BACKGROUND ART

Generally, a battery goes through a cycle of discharging electricity, which changes a chemical energy into an electrical energy and charging electricity which changes an electrical energy into a chemical energy. The most common battery is a lead storage battery, which is an application of a galvanic cell, and includes a lead (Pb) electrode and a lead dioxide ($PbO_2$) electrode in a concentrated sulfuric acid aqueous solution. The lead storage battery has a short service life due to various aging patterns, such as internal active material changes and self-discharge while experiencing charge and discharge cycles for a long time.

Meanwhile, the battery is charged with power periodically through means of the charger. In general, the charger does not have a function of diagnosing the state of the battery, besides a battery charging function. While the battery is being used by the user, the life of the battery may suddenly end. Thus, it is impossible to detect an inoperable state or a failure sign of a system operated by the battery, thereby lowering the reliability of the system.

DISCLOSURE

Technical Problem

The present disclosure is directed to providing a charger with a battery diagnosis function, which includes a digital signal processor by implementing an electrochemical impedance spectroscopy (EIS) function to measure an impedance spectrum of a battery so that the SOH of the battery may be diagnosed.

The present disclosure is also directed to providing a control method of the charger with a battery diagnosis function, which calculates a residual equivalent capacity of the battery whenever the battery is completely charged.

Technical Solution

In one general aspect, the charger with a battery diagnosis function, comprising of: a DC-DC converter configured to operate in a charging mode to charge a battery or to operate in a diagnosis mode to apply a perturbation voltage to the battery when the battery is fully charged; and a digital signal processor configured to calculate an equivalent circuit model parameter of the battery according to an output response of the battery with respect to the perturbation voltage, to calculate a charging/discharging frequency of the battery by using an ohmic resistance value among the equivalent circuit model parameter of the battery, and to calculate a residual equivalent capacity of the battery by using the charging/discharging frequency of the battery.

In addition, the digital signal processor may include a parameter analyzing unit for calculating an ohmic resistance variation equation of a quadratic equation form, which expresses a relationship between the ohmic resistance value and the charging/discharging frequency, and calculating a charging/discharging frequency of the battery by using the ohmic resistance variation equation.

In addition, the digital signal processor may include a parameter analyzing unit for calculating a residual equivalent capacity variation equation of a cubic equation form, which expresses a relationship between the charging/discharging frequency and the residual equivalent capacity, and calculating a residual equivalent capacity of the battery by using the residual equivalent capacity variation equation.

In addition, the digital signal processor may include a state estimating unit for estimating a state of the battery by comparing the residual equivalent capacity of the battery with a preset reference equivalent capacity.

In addition, the digital signal processor may include an alarming unit for outputting an alarm signal according to a comparison result between the residual equivalent capacity of the battery and a preset reference equivalent capacity.

In addition, the digital signal processor may include an impedance spectrum calculating unit for calculating a frequency-dependent complex impedance within a frequency range corresponding to the perturbation voltage according to the output response of the battery.

In addition, the digital signal processor may include a parameter extracting unit for selecting an equivalent circuit model of the battery according to the frequency-dependent complex impedance and calculating an equivalent circuit model parameter of the battery by applying a least a square method to the frequency-dependent complex impedance.

In addition, when operating in the charging mode, the DC-DC converter may fully charge the battery according to a CC-CV charging method and come into the diagnosis mode when a predetermined time lapses after the battery is fully charged.

Meanwhile, another aspect of the present disclosure is a control method of a charger with a battery diagnosis function, comprising of: applying a perturbation voltage to a battery when the battery is fully charged; calculating an equivalent circuit model parameter of the battery according to an output response of the battery with respect to the perturbation voltage; calculating a charging/discharging frequency of the battery by using an ohmic resistance value among the equivalent circuit model parameter of the battery; and calculating a residual equivalent capacity of the battery by using the charging/discharging frequency of the battery.

In addition, the calculation of a charging/discharging frequency of the battery by using an ohmic resistance value among the equivalent circuit model parameter of the battery may include: calculating an ohmic resistance variation equation of a quadratic equation form, which expresses a relationship between the ohmic resistance value and the charging/discharging frequency; and calculating a charging/discharging frequency of the battery by using the ohmic resistance variation equation.

In addition, the calculation of a residual equivalent capacity of the battery by using the charging/discharging frequency of the battery may include: calculating a residual equivalent capacity variation equation of a cubic equation form, which expresses a relationship between the charging/ discharging frequency and the residual equivalent capacity; and calculating a residual equivalent capacity of the battery by using the residual equivalent capacity variation equation.

In addition, the control method may be further comprised of comparing the residual equivalent capacity of the battery with a preset reference equivalent capacity, and outputting an alarm signal according to a comparison result thereof.

In addition, the calculation of an equivalent circuit model parameter of the battery according to an output response of the battery with respect to the perturbation voltage may include calculating a frequency-dependent complex impedance within a frequency range corresponding to the perturbation voltage according to the output response of the battery, selecting an equivalent circuit model of the battery according to the frequency-dependent complex impedance, and calculating an equivalent circuit model parameter of the battery by applying a least square method to the frequency-dependent complex impedance.

Advantageous Effects

According to the present disclosure, when a battery is charged, a state of the battery may be estimated by calculating a residual equivalent capacity of the battery. By doing so, it is possible to detect an abrupt failure sign or the like in advance and to reduce follow-up treatment and management costs caused by a failure of the battery.

BEST MODE

Figure 1:
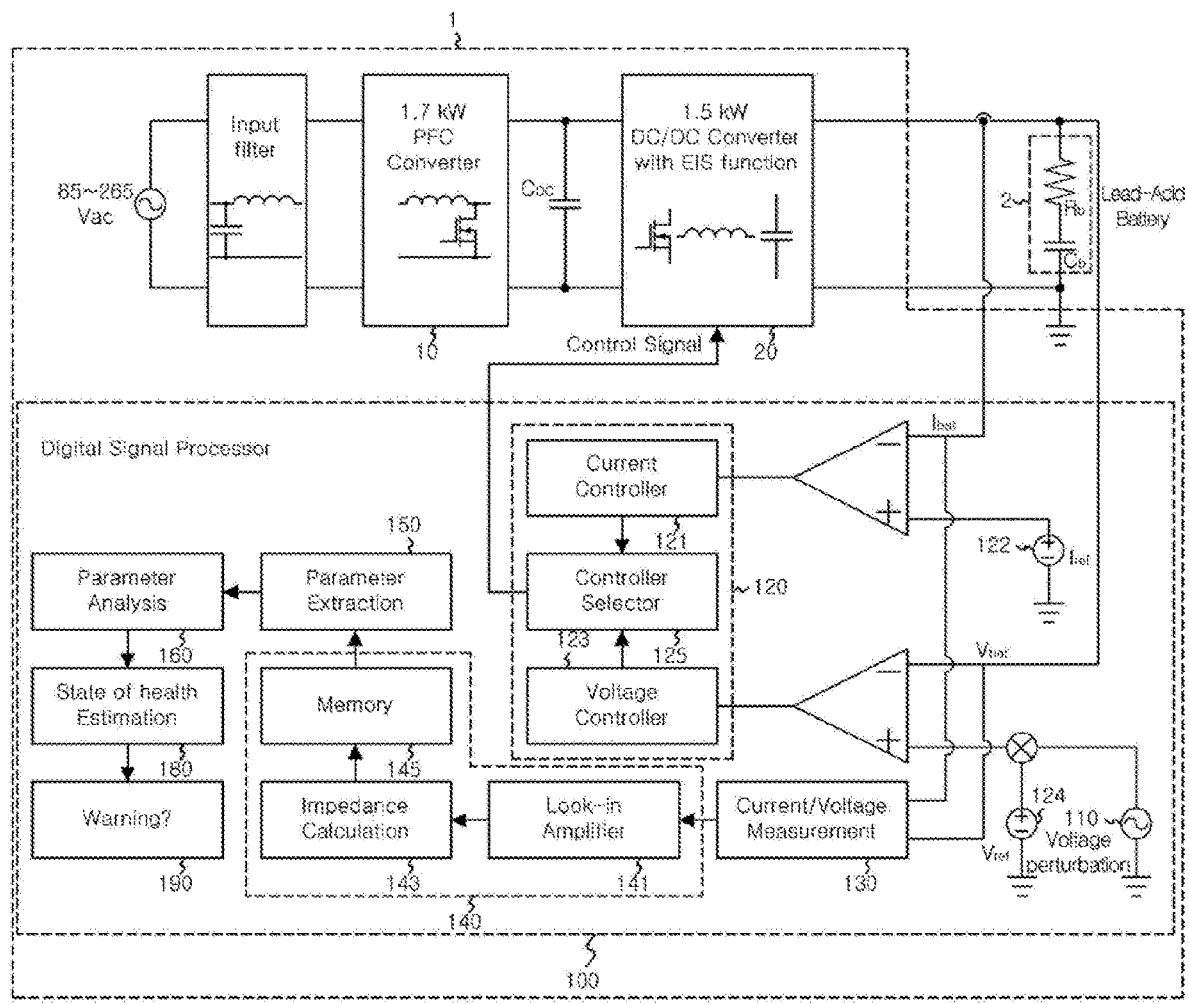
FIG. 1 is a schematic control block diagram showing a charger with a battery diagnosis function according to an embodiment of the present disclosure.

The present disclosure will be described in detail with reference to the accompanying drawings which illustrate, by way of example, specific embodiments in which the present disclosure may be implemented. These embodiments are described in sufficient detail to enable those skilled in the art to implement the present disclosure. It should be understood that various embodiments of the present disclosure are different from each other but need not be mutually exclusive. For example, specific features, structures and characteristics described herein may be implemented in other embodiments without departing from the scope of the present disclosure in connection with one embodiment. It should also be understood that the position or arrangement of individual components in each embodiment may be varied without departing from the scope of the present disclosure. Therefore, the following detailed description is not taken to limit the present disclosure, and the scope of the present disclosure is limited only by the appended claims, along with the full scope of equivalents to which such claims are entitled. In the drawings, like reference signs refer to the same or similar functions throughout several aspects.

Hereinafter, preferred embodiments of the present disclosure will be described in more detail with reference to the drawings.

FIG. 1 is a schematic control block diagram showing a charger with a battery diagnosis function according to an embodiment of the present disclosure.

Referring to FIG. 1, a charger 1 may include an AC-DC converter 10, a DC-DC converter 20, and a digital signal processor 100.

A battery 2 may be coupled between an output terminal of the charger 1 and a reference terminal (GND). The battery 2 includes an internal resistor ($R_b$) and an internal capacitor ($C_b$), and may be a lead-acid battery. However, the battery 2 is not limited to a lead-acid battery, and all other types of batteries may be applied to this embodiment.

The charger 1 may be coupled to the battery 2 to charge the battery 2 with an AC voltage of 85 V to 265 V. In addition, the charger 1 may diagnose the SOH (State-of-Health) of the battery 2 by implementing an electrochemical impedance spectroscopy (EIS) function of measuring an impedance spectrum of the battery 2 through means of the digital signal processor 100.

Hereinafter, each component of the charger 1 with a battery diagnosis function according to this embodiment will be described in detail.

The AC-DC converter 10 may be connected to an input power. The input power may include a power supply for supplying an AC voltage of 85 V to 265 V and an input filter having a capacitor and an inductor.

The AC-DC converter 10 has at least one switch which is a means of receiving an AC voltage from the input power and convert it into a DC voltage. For example, the AC-DC converter 10 may be implemented as a 1.7 kW PFC converter. The PFC converter includes a PFC controller and may perform voltage conversion by operating at least one switching means under the control of the PFC controller.

The DC-DC converter 20 may be connected to a rear end of the AC-DC converter 10. A smoothing capacitor ($C_{DC}$) for smoothing the output voltage of the AC-DC converter 10 may be connected to the rear end of the AC-DC converter 10, and the DC-DC converter 20 may be connected to the smoothing capacitor ($C_{DC}$). The output terminal of the DC-DC converter 20 forms an output terminal of the charger 1, and the battery 2 may be connected thereto.

The DC-DC converter 20 has at least one means of switching, and may convert an output voltage of the AC-DC converter 10 into a voltage to be applied to the battery 2 by operating at least one means of switching under the control of the digital signal processor 100. For example, the DC-DC converter 20 may be implemented as a 1.5 kW phase-shifting soft-switching DC-DC converter.

The DC-DC converter 20 may operate in a charging mode or in a diagnosis mode. When operating in the charging mode, the DC-DC converter 20 may charge the battery 2 by applying a charge voltage or a charge current to the battery 2 according to a CC-CV charging method. When operating in the diagnosis mode, the DC-DC converter 20 may apply a perturbation voltage to the battery 2 according to a perturbation signal generated at the digital signal processor 100, thereby inducing a response of the battery 2 according to the perturbation voltage. The DC-DC converter 20 operates in the charging mode to fully charge the battery 2 and comes into the diagnosis mode when a predetermined time, for example one hour, lapses.

The digital signal processor 100 controls the DC-DC converter 20 to charge the battery 2 and diagnose a state of the battery 2. For this, the digital signal processor 100 may include a perturbation signal generating unit 110, a control unit 120, a current/voltage detecting unit 130, an impedance spectrum calculating unit 140, a parameter extracting unit 150, a parameter analyzing unit 160, a state estimating unit 180, and an alarming unit 190.

The perturbation signal generating unit 110 may generate a sine wave-type perturbation signal. The perturbation signal may be transmitted to a voltage controller 123 in addition to a reference voltage ($V_{ref}$) output through a reference voltage generating unit 124.

The control unit 120 may generate a control signal for controlling the DC-DC converter 20 according to the charging mode or the diagnosis mode, and may apply the control signal to the DC-DC converter 20. The control unit 120 may include a current controller 121, a voltage controller 123, and a controller selecting unit 125.

When charging a constant current according to the CC-CV charging method, the current controller 121 may generate a current control signal according to a battery current ($I_{bat}$) and a reference current ($I_{ref}$) output through the reference current generating unit 122.

When charging a constant voltage according to the CC-CV charging method, the voltage controller 123 may generate a voltage control signal according to a battery voltage ($V_{bat}$) and a reference voltage ($V_{ref}$) output through the reference voltage generating unit 124.

The controller selecting unit 125 may select the current controller 121 or the voltage controller 123 according to the CC-CV charging method and apply a current control signal or a voltage control signal to the DC-DC converter 20. That is, when charging a constant current, the controller selecting unit 125 may select the current controller 121 and apply the current control signal to the DC-DC converter 20. When charging a constant voltage, the controller selecting unit 125 may select the voltage controller 123 and apply the voltage control signal to the DC-DC converter 20. By generating the charge current or charge voltage of the battery 2 according to the current control signal or the voltage control signal, the DC-DC converter 20 may prevent a charge current or a charge voltage exceeding an allowable range from being supplied to the battery 2.

Meanwhile, if the battery 2 is completely charged, the voltage controller 123 may control the DC-DC converter 20 to come into the diagnosis mode. If a predetermined time elapses after the battery 2 is fully charged, the voltage controller 123 may apply a perturbation signal to the DC-DC converter 20. By generating a perturbation voltage according to the perturbation signal and applying it to the battery 2, the DC-DC converter 20 may induce an output response signal (a voltage of several tens of mV) corresponding thereto.

The current/voltage detecting unit 130 may detect a battery current ($I_{bat}$) and a battery voltage ($V_{bat}$) and transmit the same to the impedance spectrum calculating unit 140.

The impedance spectrum calculating unit 140 may calculate a frequency-dependent impedance of the battery 2 within a frequency range corresponding to the perturbation voltage according to the output response signal of the battery 2 with respect to the perturbation voltage. To this end, the impedance spectrum calculating unit 140 may include a lock-in amplifier 141, an impedance computing unit 143, and a memory unit 145.

The lock-in amplifier 141 may calculate a magnitude and phase of the output response signal of the battery 2 with respect to the perturbation voltage.

Specifically, the lock-in amplifier 141 may set the perturbation signal as in Equation 1 below as the reference signal.

$$r(t)=\sin(\omega_0 t) \quad \text{(Equation 1)}$$

The lock-in amplifier 141 may set an output response signal as in Equation 2 below as an input signal. The input signal may be represented as in Equation 2 below, including harmonic wave distortion and noise in the reference signal.

$$i(t)=A\sin(\omega_0 t+\theta)+n(t) \quad \text{(Equation 2)}$$

The lock-in amplifier 141 may obtain signals as in Equations 3 and 4 below by multiplying the input signal by the reference signal and a signal having a phase 90 degrees ahead of the reference signal, respectively.

$$P_p(t)=i(t)\times r_p(t)=\tfrac{1}{2}A\cos(\theta)-\tfrac{1}{2}A\cos(2\omega_0 t+\theta)+n_p(t) \quad \text{(Equation 3)}$$

$$p_q(t)=i(t)\times r_q(t)=\tfrac{1}{2}A\sin(\theta)+\tfrac{1}{2}A\sin(2\omega_0 t+\theta)+n_q(t) \quad \text{(Equation 4)}$$

The lock-in amplifier 141 may calculate an in-phase component and an orthogonal component for the reference signal as in Equation 5 by filtering the signals as in Equations 3 and 4 to remain only the DC component.

$$x=2\overline{p_p}\approx A\cos(\theta),\ y=2\overline{p_q}\approx A\sin(\theta) \quad \text{(Equation 5)}$$

The lock-in amplifier 141 may express the magnitude and phase of the input signal as in Equation 6 below by using Equation 5.

$$M = \sqrt{x^2 + y^2} = A,\ \theta = \tan^{-1}\left(\frac{y}{x}\right) \quad \text{[Equation 6]}$$

The impedance computing unit 143 may calculate an impedance of the battery 2 according to the output response signal of the battery 2 with reference to the perturbation voltage. At this time, the perturbation voltage may have a predetermined frequency range. In this embodiment, the frequency range of the perturbation voltage may be set to be 0.1 Hz to 1 kHz. The impedance computing unit 143 may calculate the frequency-dependent impedance of the battery 2 within the frequency range of 0.1 Hz to 1 kHz.

Specifically, the impedance computing unit 143 may represent a complex impedance of the battery 2 by using the magnitude and phase of the output response signal of the battery 2 as in Equation 6 above.

$$Z(\omega_0)=R(\omega_0)+jX(\omega_0) \quad \text{(Equation 7)}$$

In Equation 7, real and imaginary components may be expressed as in Equation 8 and 9, respectively.

$$R(\omega_0) = \operatorname{Re}\left\{\frac{V(\omega_0)}{I(\omega_0)}\right\} = \frac{V_X I_X + V_Y I_Y}{I_X^2 + I_Y^2} \quad \text{[Equation 8]}$$

$$X(\omega_0) = \operatorname{Im}\left\{\frac{V(\omega_0)}{I(\omega_0)}\right\} = \frac{V_Y I_X + V_X I_Y}{I_X^2 + I_Y^2} \quad \text{[Equation 9]}$$

The memory unit 145 may store the frequency-dependent complex impedance of the battery 2 within a frequency range of 0.1 Hz to 1 kHz. The memory unit 145 may obtain an impedance model of the battery 2 within the frequency range of 0.1 Hz to 1 kHz.

The parameter extracting unit 150 may calculate an equivalent circuit model parameter of the battery 2 by using the frequency-dependent complex impedance of the battery 2.

Specifically, the parameter extracting unit 150 may select an equivalent circuit model of the battery according to the frequency-dependent complex impedance stored in the memory unit 145. The parameter extracting unit 150 may select an equivalent circuit model containing elements reflecting the electrochemical response of the battery 2.

Figure 2:
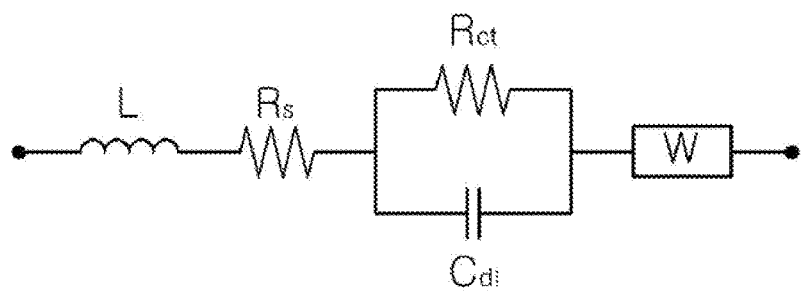
FIG. 2 is a diagram showing an example of an equivalent circuit model of a battery, selected according to an embodiment of the present disclosure.

FIG. 2 is a diagram showing an example of an equivalent circuit model of a battery, selected according to an embodiment of the present disclosure.

Referring to FIG. 2, L represents an inductance, which indicates the inductance generated by a metal bond between electrodes. $R_s$ is an ohmic resistance, which may be determined by the conductivity of an electrolyte and an electrical path. $R_{ct}$ and $C_{dl}$ are elements for explaining a transient operation caused by charge transfer. W represents a Warburg impedance and is an element to explain the diffusion of the battery.

The parameter extracting unit 150 may extract a parameter of the selected equivalent circuit model by applying the least square method to the frequency-dependent complex impedance stored in the memory unit 145. The parameter extracting unit 150 may extract the parameter of the equivalent circuit model by applying a complex nonlinear least-square (CNLS) method among the least square methods. The CNLS method is a Levenberg Marquardt least square method that is able to be applied to complex numbers.

In the parameter extracting unit 150, if the step of extracting an equivalent circuit model parameter is explained based on the example where the equivalent circuit model depicted in FIG. 2 is selected, the frequency-dependent complex impedance applied to the least square method may be expressed as in Equation 10 below.

$$z(\omega)=f(\omega;\theta_i);\ \theta_i=L,R_s,R_{ct},C_{dl},W \quad \text{(Equation 10)}$$

Each element (L, $R_s$, $R_{ct}$, $C_{dl}$, W) of the equivalent circuit model may be extracted as a function φ as in Equation 11 below.

$$\Phi = \sum_{i=1}^{n} [\text{Re}\ (y_i - Z_i)^2 - \text{Im}\ (y_i - Z_i)^2] \quad \text{[Equation 11]}$$

When the equivalent circuit model parameter is changed, the parameter extracting unit 150 may calculate an approximate equivalent circuit model parameter by applying the Taylor series method as in Equation 12 below.

$$Z(\omega)_{j+1} = Z(\omega)_j + \frac{\partial Z(\omega)_j}{\partial \theta_i}\Delta\theta_i,\ i = 1, 2, \ldots, 5 \quad \text{[Equation 12]}$$

The variation of the equivalent circuit model parameter according to Equation 12 may be expressed as in Equation 13 below.

$$\Delta\theta = A^{-1}G \quad \text{[Equation 13]}$$

$$A = [(Z_r)^T Z_R + (Z_I)^T Z_I]$$

$$G = [(Z_R)^T \Delta y_R + (Z_I)^T \Delta y_I]$$

$$[Z_R]_{ij} = \text{Re}\left(\frac{\partial Z_i}{\partial \theta_i}\right);\ [Z_I]_{ij} = \text{Im}\left(\frac{\partial Z_i}{\partial \theta_i}\right)$$

$$[\Delta y_R]_j = \text{Re}\ (Y_i - Z_i);\ [\Delta y_I]_j = \text{Im}\ (Y_i - Z_i)$$

The parameter extracting unit 150 may extract the parameter of the equivalent circuit model in this way, and may extract the parameter of the equivalent circuit model and store the same in a database whenever the battery 2 is completely charged and discharged.

The parameter analyzing unit 160 may calculate a charging/discharging frequency of the battery 2 by using the parameter of the equivalent circuit model of the battery 2 and calculate a residual equivalent capacity of the battery 2 by using the charging/discharging frequency of the battery 2.

Specifically, the parameter analyzing unit 160 may calculate an ohmic resistance variation equation representing the relationship between the ohmic resistance value ($R_s$) and the charging/discharging frequency by using the ohmic resistance value ($R_s$) among the parameters of the equivalent circuit model of the battery 2.

It is widely known that the SOH of battery 2 may be estimated from the internal impedance of battery 2. In particular, referring to Table 1 below, the equivalent circuit model parameters of the battery 2 according to the charging/discharging frequency may be found. Here, it may be found that the ohmic resistance value ($R_s$) among the parameters of the equivalent circuit model of the battery 2 linearly increases, compared to other parameters.

TABLE 1

| Aging cycles | 0 | 8 | 28 | 48 | 68 | 88 | 108 | 128 | 148 | 168 | 185 |
|---|---|---|---|---|---|---|---|---|---|---|---|
| Rs (mOhm) | 74.98 | 75.43 | 75.55 | 75.92 | 76.53 | 76.56 | 77.15 | 78.09 | 78.42 | 78.55 | 79.95 |
| Wy | 15 | 15 | 14.86 | 14.71 | 14.73 | 14.72 | 15.24 | 15.31 | 14.65 | 16.16 | 15.91 |
| Ls (uH) | 4.47 | 4.45 | 4.55 | 4.83 | 4.72 | 4.74 | 4.45 | 4.68 | 4.68 | 4.43 | 4.65 |
| Rct * CdI (ms) | 7.732 | 8.594 | 8.718 | 9.411 | 10.18 | 9.728 | 9.649 | 10.4 | 10.72 | 16.3 | 15.69 |

Figure 3:
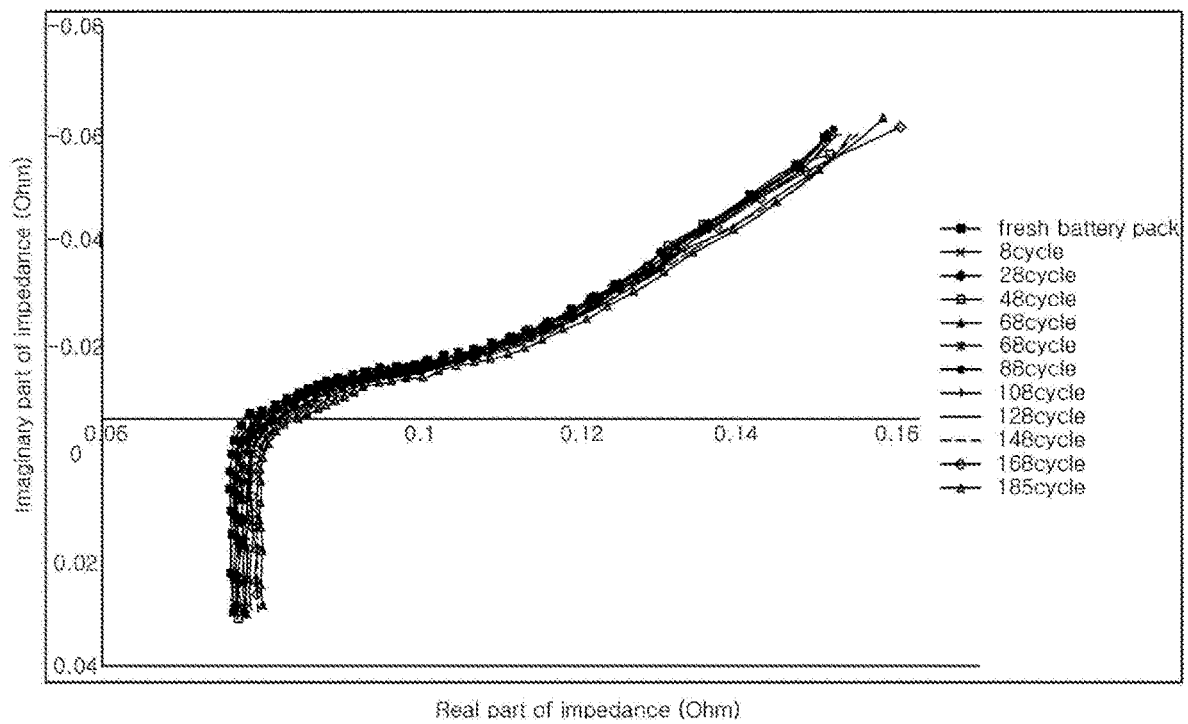
FIG. 3 is a graph showing a relationship between an internal impedance of the battery, obtained through an experiment, and a charging/discharging frequency.
Figure 4:
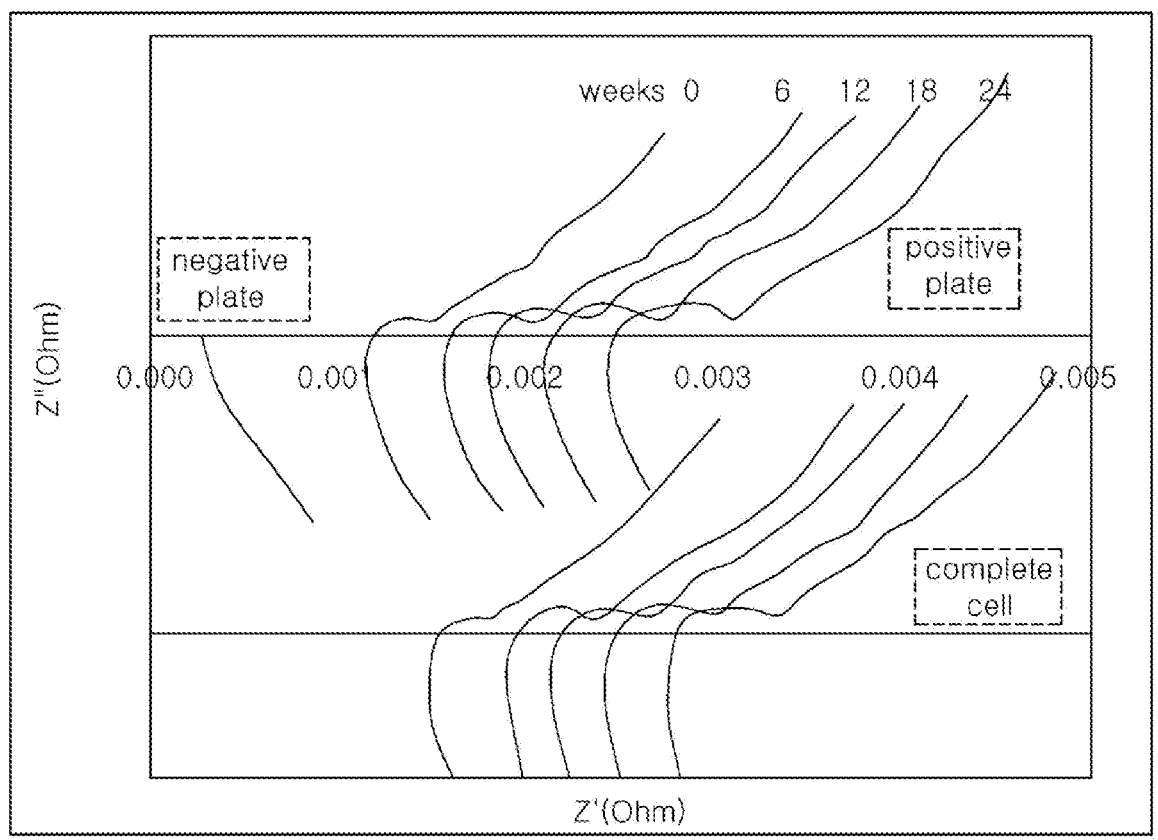
FIG. 4 is a graph showing a variation of the internal impedance according to aging of the battery.

FIG. 3 is a graph showing a relationship between an internal impedance of the battery, obtained through an experiment, and a charging/discharging frequency, and FIG. 4 is a graph showing a variation of the internal impedance based on aging of the battery.

Referring to FIG. 3, the battery 2 repeats charging and discharging 185 times, and the ohmic resistance value ($R_s$) of the battery 2 obtained at every $20^{th}$ time may be found. It may be found that, as the charging/discharging frequency of the battery 2 increases, Nyquist plot showing the ohmic resistance value ($R_s$) maintains its overall shape but moves to the right.

Also, referring to FIG. 4, the variation of the ohmic resistance value ($R_s$) of the battery 2 caused by aging of the battery 2 may be found, and it shows a similar pattern to the graph shown in FIG. 3. From this, it may be understood that the ohmic resistance value ($R_s$) among the parameters of the equivalent circuit model of the battery 2 is a more desirable factor to determine the aging of the battery 2 compared to other parameters.

Thus, the parameter analyzing unit 160 may calculate the ohmic resistance variation equation by using the ohmic resistance value ($R_s$) that is extracted and accumulated whenever the battery 2 is completely charged and discharged.

Figure 5:
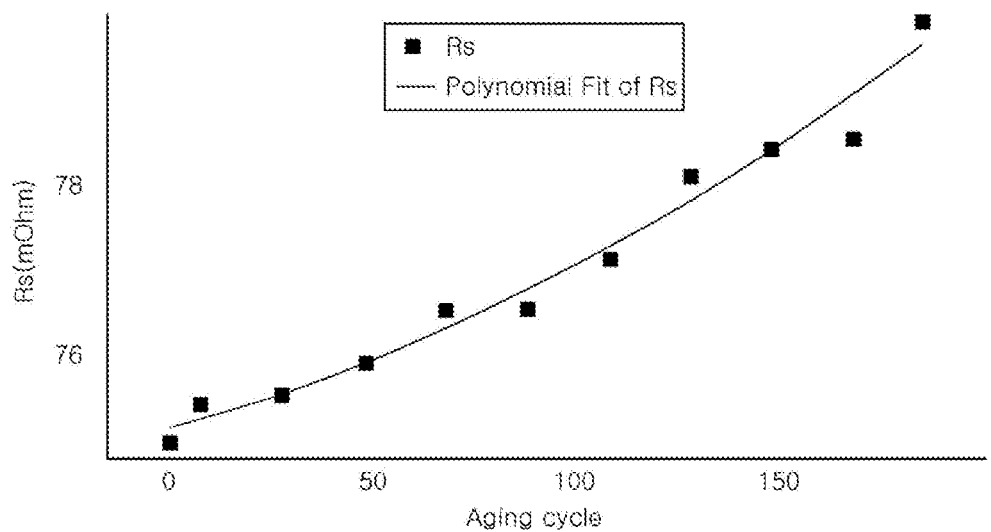
FIG. 5 shows an example of a graph expressing an ohmic resistance value ($R_s$) extracted and accumulated whenever the battery is completely charged and discharged.

FIG. 5 shows an example of a graph expressing an ohmic resistance value ($R_s$) extracted and accumulated whenever the battery 2 is completely charged and discharged.

Referring to FIG. 5, it may be found that the ohmic resistance value ($R_s$) according to charging/discharging frequency of the battery 2 is approximately a graph according to a quadratic equation.

The parameter analyzing unit 160 calculate an ohmic resistance variation equation showing the relationship between the ohmic resistance value ($R_s$) and the charging/discharging frequency (x) by performing curve fitting on the ohmic resistance value ($R_s$) that is extracted and accumulated whenever the battery 2 is finished charging and discharging as described above. As shown in FIG. 5, the ohmic resistance variation equation may be calculated in a quadratic equation form, and may be expressed as in Equation 14 below.

$$\text{Ohmic Resistance}(Rs),\ y = A_1 + A_2 x + A_3 x^2 \qquad \text{(Equation 14)}$$

In the graph of FIG. 5, $A_1$, $A_2$ and $A_3$ may be calculated as values in Table 2 below.

TABLE 2

| Coefficient | Value |
|---|---|
| $A_1$ | 75.15752 |
| $A_2$ | 0.01285 |
| $A_3$ | $2.692 \times 10^{-6}$ |

The parameter analyzing unit 160 may calculate the charging/discharging frequency of the battery 2 by applying the ohmic resistance value ($R_s$) currently extracted by the parameter extracting unit 150 to the ohmic resistance variation equation as in Equation 14.

$$x = \frac{-A_2 \pm \sqrt{A_2^2 - 4A_3(A_1 - R_S)}}{2A_3} \qquad \text{[Equation 15]}$$

If a quadratic formula is applied to Equation 14, it is possible to calculate two roots, namely a positive value and a negative value, as in Equation 15. The parameter analyzing unit 160 may obtain the positive value of the two roots as the charging/discharging frequency of the battery 2. The parameter analyzing unit 160 may store the charging/discharging frequency and the ohmic resistance value ($R_s$) in a database whenever the charging/discharging frequency of the battery 2 is calculated, and this database may be used later to calculate the ohmic resistance variation equation.

Also, the parameter analyzing unit 160 may calculate a residual equivalent capacity variation equation representing the relationship between the charging/discharging frequency of the battery 2 and the residual equivalent capacity ($C_m$).

It is obvious that the residual equivalent capacity ($C_m$) of the battery 2 decreases as the charging/discharging frequency of the battery 2 increases. Referring to Table 3 below, the variation in the residual capacity (Ah) of the battery 2 according to the increase of the charging/discharging frequency may be found.

TABLE 3

| Aging cycles | 0 | 8 | 28 | 48 | 68 | 88 | 108 | 128 | 148 | 168 | 185 |
|---|---|---|---|---|---|---|---|---|---|---|---|
| Capacity (Ah) | 90 | 89.2 | 89 | 88 | 85 | 82 | 81 | 80 | 78.6 | 78 | 75 |
| Capacity (%) | 100 | 99.1 | 98.9 | 97.8 | 94.4 | 91.1 | 90 | 88.9 | 87.3 | 86.7 | 83.3 |

Figure 6:
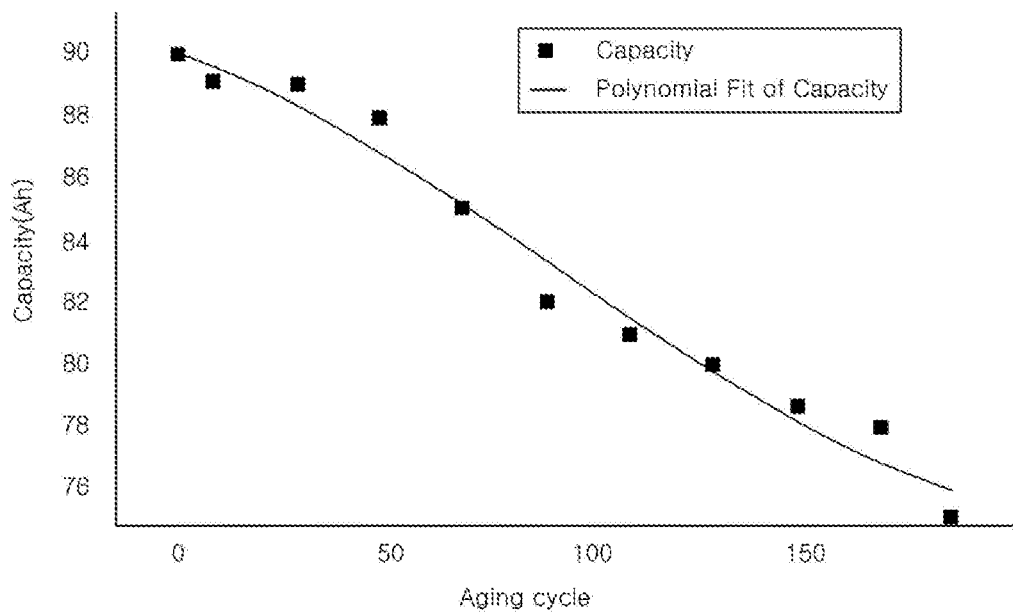
FIG. 6 shows an example of a graph expressing a battery capacity (Ah) according to a charging/discharging frequency of the battery.

FIG. 6 shows an example of a graph expressing a battery capacity (Ah) according to a charging/discharging frequency of the battery.

Referring to FIG. 6, it may be found that the battery capacity (Ah) according to the charging/discharging frequency of the battery 2 has a graph form approximately according to a cubic equation.

As described above, the parameter analyzing unit 160 may calculate the residual equivalent capacity variation equation representing the relationship between the residual equivalent capacity ($C_m$) of the battery 2 and the charging/discharging frequency (x) by performing curve fitting on the charging/discharging frequency of the battery 2 calculated from the ohmic resistance variation equation. As shown in FIG. 6, the residual equivalent capacity variation equation may be calculated in a cubic equation form, and may be expressed as in Equation 16 below.

$$\text{Battery Capacity}(Cm),\ y = B_1 + B_2 x + B_3 x^2 + B_4 x^3 \qquad \text{(Equation 16)}$$

In the graph of FIG. 6, $B_1$, $B_2$, $B_3$ and $B_4$ may be calculated as values in Table 4 below.

TABLE 4

| Coefficient | Value |
|---|---|
| $B_1$ | 90.1382 |
| $B_2$ | −0.05071 |
| $B_3$ | $-4.50214 \times 10^{-4}$ |
| $B_4$ | $1.6708 \times 10^{-6}$ |

The parameter analyzing unit 160 may calculate the residual equivalent capacity of the battery 2 by applying the charging/discharging frequency of the battery 2 according to the ohmic resistance value ($R_s$) currently extracted by the parameter extracting unit 150 to the residual equivalent capacity variation equation as in Equation 16. Whenever the residual equivalent capacity of the battery 2 is calculated, the parameter analyzing unit 160 may store the residual equivalent capacity and the charging/discharging frequency of the battery 2 in a database, and the database may be used later to calculate the residual equivalent capacity variation equation.

The state estimating unit 180 may estimate the state of the battery 2 by comparing the residual equivalent capacity of the battery 2 calculated by the parameter analyzing unit 160 with a preset reference equivalent capacity. For example, the reference equivalent capacity may be set to be 80% of the initial capacity of the battery 2. In usual cases, if the capacity of the battery 2 is lowered then 80% or below of its initial capacity, the battery 2 is generally discarded. Thus, the state estimating unit 180 may determine whether the battery 2 is to be discarded by comparing the residual equivalent capacity of the battery 2 calculated by the parameter analyzing unit 160 with the preset reference equivalent capacity.

The alarming unit 190 may output an alarm signal in response to the estimation result of the state of the battery 2 by the state estimating unit 180. The alarming unit 190 may output a voice signal or display the state estimation result of the battery 2 on a screen. The alarming unit 190 may output the alarm signal if the residual equivalent capacity of the battery 2 is lower to the preset reference equivalent capacity.

Hereinafter, a control method of the charger with a battery diagnosis function according to an embodiment of the present disclosure will be described with reference to FIG. 7.

Figure 7:
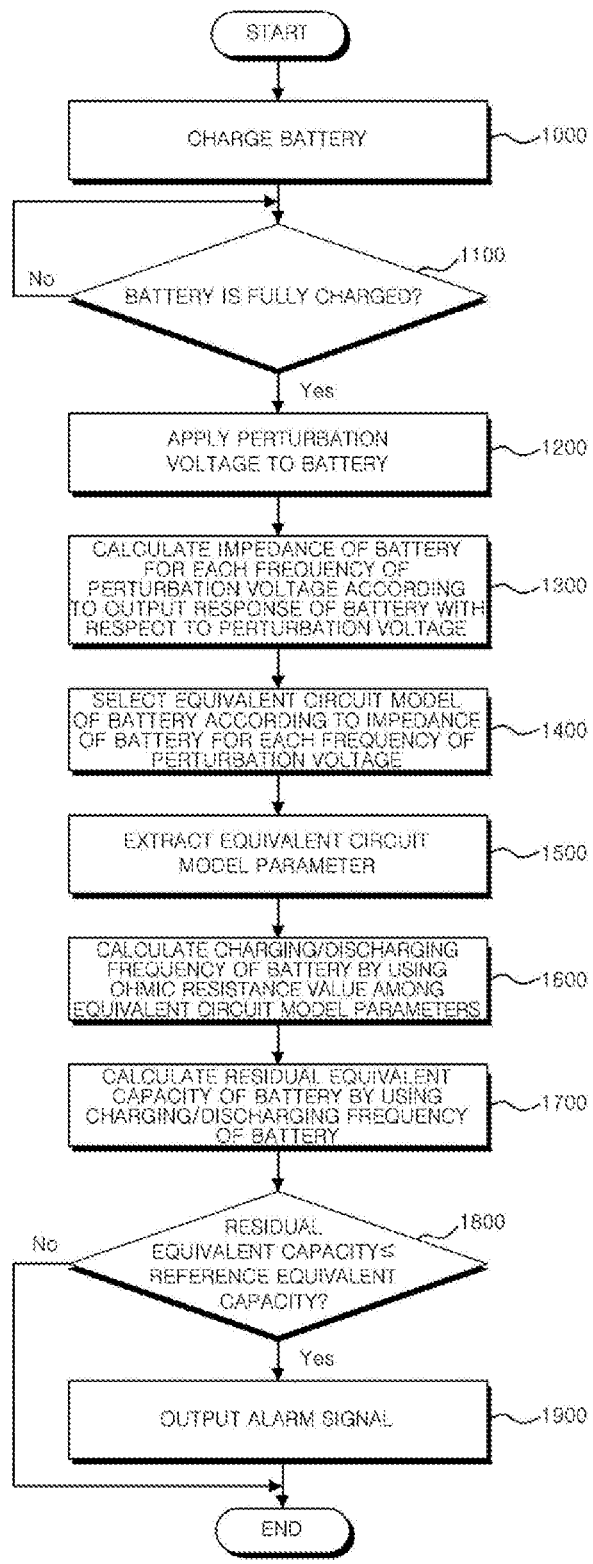
FIG. 7 is a flowchart for illustrating a control method of the charger with a battery diagnosis function according to an embodiment of the present disclosure.

FIG. 7 is a flowchart for illustrating a control method of the charger with a battery diagnosis function according to an embodiment of the present disclosure.

Referring to FIG. 7, the DC-DC converter 20 may perform voltage conversion to charge the battery 2 (1000). The DC-DC converter 20 may charge the battery 2 according to the CC-CV charging method.

If the battery 2 is fully charged (1100), the DC-DC converter 20 may apply a perturbation voltage to the battery 2 (1200).

The perturbation signal generating unit 110 may generate a perturbation signal for generating a perturbation voltage having a frequency range of 0.1 Hz to 1 kHz. The DC-DC converter 20 may generate the perturbation voltage according to the perturbation signal and apply it to the battery 2 to thereby induce an output response corresponding thereto.

The impedance spectrum calculating unit 140 may calculate the impedance of the battery 2 for each frequency of the perturbation voltage according to the output response of the battery 2 with respect to the perturbation voltage (1300). The impedance spectrum calculating unit 140 may calculate and store the frequency-dependent complex impedance of the battery 2 within a frequency range of 0.1 Hz to 1 kHz according to Equations 1 to 9 above.

The parameter extracting unit 150 may select an equivalent circuit model of the battery 2 according to the impedance of the battery 2 for each frequency of the perturbation voltage (1400) and extract the parameters of the selected equivalent circuit model (1500).

The parameter extracting unit 150 may select the equivalent circuit model as shown in FIG. 2 according to the impedance of the battery 2 for each frequency of the perturbation voltage. The parameter extracting unit 150 may calculate the parameters of the equivalent circuit model by applying the least square method to the impedance of the battery 2 for each frequency of the perturbation voltage as in Equations 10 to 13 above.

The parameter analyzing unit 160 may calculate the charging/discharging frequency of the battery by using the ohmic resistance value ($R_s$) among the parameters of the equivalent circuit model (1600).

The parameter analyzing unit 160 may calculate the ohmic resistance variation equation of a quadratic equation form showing the relationship between the ohmic resistance value ($R_s$) and the charging/discharging frequency as in Equation 14 above. The parameter analyzing unit 160 may calculate the charging/discharging frequency of the battery 2 by applying the ohmic resistance value ($R_s$) currently extracted by the parameter extracting unit 150 to the ohmic resistance variation equation. The parameter analyzing unit 160 may store the charging/discharging frequency and the ohmic resistance value ($R_s$) in a database whenever the charging/discharging frequency of the battery 2 is calculated, and the database may be used later to calculate the ohmic resistance variation equation.

The parameter analyzing unit 160 may calculate the residual equivalent capacity ($C_m$) of the battery 2 by using the charging/discharging frequency of the battery (1700).

The parameter analyzing unit 160 may calculate the residual equivalent capacity variation equation of a cubic equation form showing the relationship between the charging/discharging frequency and the residual equivalent capacity ($C_m$) as in Equation 16 above. The parameter analyzing unit 160 may calculate the residual equivalent capacity ($C_m$) of the battery 2 by applying the charging/discharging frequency of the battery 2 to the residual equivalent capacity variation equation. The parameter analyzing unit 160 may store the residual equivalent capacity and the charging/discharging frequency in a database whenever the residual equivalent capacity ($C_m$) of the battery 2 is calculated, and the database may be used later to calculate the residual equivalent capacity variation equation.

The state estimating unit 180 may compare the residual equivalent capacity ($C_m$) with the reference equivalent capacity (1800).

If the residual equivalent capacity ($C_m$) is equal to or lower than the reference equivalent capacity, the alarming unit 190 may output an alarm signal to inform this (1900).

The vehicle remote key system and the control method for a charger having a battery diagnosis function according to an embodiment of the present disclosure may be implemented in the form of an application or program commands executable by various computer components and be recorded on a computer-readable recording medium. The computer-readable recording medium may include program commands, data files, data structures or the like solely or in combination.

The program commands recorded on the medium may be specially designed or configured for the present disclosure or known to and available by computer software engineers.

The computer-readable recording medium includes, for example, magnetic media such as a hard disk, a floppy disk and a magnetic tape, optical media such as CD-ROM and DVD, magneto-optical media such as a floptical disk, hardware devices such as ROM, RAM and a flash memory, specially configured to store and perform program commands, or the like.

The program commands include not only machine codes made by a complier but also high-level language codes executable by a computer by using an interpreter. The hardware device may be configured to operate as at least one software module to perform the operations of the present disclosure, or vice versa.

While the present disclosure has been described with reference to the embodiments, it will be understood by those skilled in the art that various changes and modifications can be made without departing from the scope of the present disclosure as set forth in the appended claims.

INDUSTRIAL APPLICABILITY

The charger with a battery diagnosis function according to the present disclosure includes a digital signal processor for controlling a converter that performs a charging function and thus may perform an EIS function of measuring the impedance of a battery. In other words, although expensive commercial equipment is required to diagnose the battery in the existing technique, in the present disclosure, the life diagnosis function may be implemented without additional hardware and cost.

Thus, it is possible to reduce the administrative expenses, such as regular diagnosis, inspection, maintenance and discharge test of a battery module and the incidental expenses caused by the minimization of the management personnel.

In addition, by developing high value-added products equipped with advanced functions against low-cost chargers of developing countries that are currently being supplied to the market, it is possible to enhance product competitiveness and pioneer new markets.

The charger with a battery diagnosis function according to the present disclosure may be utilized for electric vehicles, fuel cell cars, railways, subways, airlines, port facilities, firefighting and control facilities, power companies, power stations, broadcasting stations, broadcasting facilities and the like.

In addition, the charger with a battery diagnosis function according to the present disclosure may be utilized for wired/wireless communications unauthorized national stations, telephone stations, assembled buildings, communication facilities, UPS and the like.

In addition, the charger with a battery diagnosis function according to the present disclosure may also be utilized for computer centers, laboratories, banks and second financial sectors, insurance companies, security firms, card companies, hospitals, emergency rescue services, emergency medical stations and the like.

In addition, the charger with a battery diagnosis function according to the present disclosure may also be utilized for military communication facilities, reserve power supply facilities, transportation maintenance fields and the like.

The invention claimed is:

1. A charger comprising:
    a DC-DC converter configured to apply a perturbation voltage to a battery when the DC-DC converter charges the battery in a charging mode or when the battery is fully charged; and
    a digital signal processor configured to:
        calculate an equivalent circuit model parameter of the battery by using a frequency-dependent complex impedance of the battery,
        calculate a charging/discharging frequency of the battery by using an ohmic resistance value among the equivalent circuit model parameter of the battery,
        calculate a residual equivalent capacity of the battery by using the charging/discharging frequency of the battery, and
        estimate a state of the battery and output an alarm signal according to a comparison result between the residual equivalent capacity of the battery and a preset reference equivalent capacity;
    wherein the digital signal processor includes an impedance spectrum calculating unit which calculates the frequency-dependent complex impedance within a frequency range corresponding to the perturbation voltage according to an output response of the battery.

2. The charger of claim 1,
    wherein the digital signal processor includes a parameter analyzing unit, which calculates an ohmic resistance variation equation of a quadratic equation form, which expresses a relationship between the ohmic resistance value and the charging/discharging frequency, and calculates the charging/discharging frequency of the battery by using the ohmic resistance variation equation.

3. The charger of claim 1,
    wherein the digital signal processor includes a parameter analyzing unit which calculates a residual equivalent capacity variation equation of a cubic equation form, which expresses a relationship between the charging/discharging frequency and the residual equivalent capacity, and calculates the residual equivalent capacity of the battery by using the residual equivalent capacity variation equation.

4. The charger of claim 1,
    wherein the digital signal processor includes a state estimating unit which estimates the state of the battery by comparing the residual equivalent capacity of the battery with a preset reference equivalent capacity.

5. The charger of claim 1,
    wherein the digital signal processor includes a parameter extracting unit which selects an equivalent circuit model of the battery according to the frequency-dependent complex impedance and calculates the equivalent circuit model parameter of the battery by applying a least square method to the frequency-dependent complex impedance.

6. The charger of claim 1,
    wherein the DC-DC converter fully charges the battery according to a CC-CV charging method while in the charging mode and comes into the diagnosing mode when a predetermined time lapses after the battery is fully charged.

7. The charger of claim 1, wherein the alarm signal comprises a voice signal or a warning on a display panel.

8. A control method of a charger with a battery diagnosis function, the control method comprising:
    applying a perturbation voltage to a battery when the battery is fully charged;
    calculating an equivalent circuit model parameter of the battery by using a frequency-dependent complex impedance of the battery;
    calculating a charging/discharging frequency of the battery by using an ohmic resistance value among the equivalent circuit model parameter of the battery;
    calculating a residual equivalent capacity of the battery by using the charging/discharging frequency of the battery; and
    estimating a state of the battery and outputting an alarm signal according to a comparison result between the residual equivalent capacity of the battery and a preset reference equivalent capacity;
    wherein the step of the calculating of the charging/discharging frequency of the battery by using the ohmic resistance value among the equivalent circuit model parameter of the battery includes:
        calculating an ohmic resistance variation equation of a quadratic equation form, which expresses a relationship between the ohmic resistance value and the charging/discharging frequency; and
        calculating the charging/discharging frequency of the battery by using the ohmic resistance variation equation.

9. The control method of claim 8, wherein the step of the calculating of the residual equivalent capacity of the battery by using the charging/discharging frequency of the battery includes:

calculating a residual equivalent capacity variation equation of a cubic equation form, which expresses a relationship between the charging/discharging frequency and the residual equivalent capacity; and calculating the residual equivalent capacity of the battery by using the residual equivalent capacity variation equation.

10. The control method of claim 8, wherein the step of the calculating of the equivalent circuit model parameter of the battery according to the output response of the battery with respect to the perturbation voltage includes:

calculating the frequency-dependent complex impedance within a frequency range corresponding to the perturbation voltage according to the output response of the battery;

selecting an equivalent circuit model of the battery according to the frequency-dependent complex impedance; and calculating the equivalent circuit model parameter of the battery by applying a least square method to the frequency-dependent complex impedance.

\* \* \* \* \*